United States Patent [19]

Altwein

[11] Patent Number: 5,777,235

[45] Date of Patent: Jul. 7, 1998

[54] STRAIN GAGE MEASURING ARRANGEMENT, USE OF SAME, AND MODULATION AMPLIFIER FOR SUCH MEASURING ARRANGEMENTS

[76] Inventor: Michael Altwein, Schbertweg 13, DE-64287 Darmstadt, Germany

[21] Appl. No.: 665,049

[22] Filed: Jun. 7, 1996

Related U.S. Application Data

[63] Continuation of Ser. No. 542,129, Oct. 12, 1995, abandoned, which is a continuation of Ser. No. 280,883, Jul. 27, 1994, abandoned.

[30] Foreign Application Priority Data

May 17, 1994 [DE] Germany ............... 44 17 228.1

[51] Int. Cl.[6] ........................................ G01L 1/16
[52] U.S. Cl. ........................ 73/769; 73/763; 73/774; 73/855
[58] Field of Search ............... 73/763, 769, 774, 73/885; 177/211

[56] References Cited

U.S. PATENT DOCUMENTS

| | | | |
|---|---|---|---|
| 2,625,036 | 1/1953 | Cowles ............................. | 73/773 |
| 3,224,256 | 12/1965 | Hastings ........................... | 73/770 |
| 3,354,703 | 11/1967 | Russell, Jr. et al. ............... | 73/770 |
| 3,617,878 | 11/1971 | Senour ............................. | 73/769 |
| 3,657,660 | 4/1972 | Pfersch ............................ | 73/769 |
| 3,665,756 | 5/1972 | Russell ............................ | 73/769 |
| 3,956,927 | 5/1976 | Pearson ........................... | 73/769 |
| 3,965,429 | 6/1976 | Roberts, III ..................... | 73/769 |
| 4,059,991 | 11/1977 | Dybel et al. ...................... | 73/769 |
| 4,064,456 | 12/1977 | Grove ............................. | 73/769 |
| 4,155,263 | 5/1979 | Frantz ............................. | 73/771 |
| 4,213,348 | 7/1980 | Reinertson et al. ................ | 73/769 |
| 4,461,182 | 7/1984 | Jones, Jr. et al. ................. | 73/770 |
| 4,600,347 | 7/1986 | Segredo et al. ................... | 73/774 |
| 4,606,205 | 8/1986 | Segredo et al. ................... | 73/774 |
| 4,868,411 | 9/1989 | Ishihara ........................... | 73/770 |
| 5,088,330 | 2/1992 | Talmadge ......................... | 73/769 |

FOREIGN PATENT DOCUMENTS

| | | |
|---|---|---|
| 0 319 176 B1 | 3/1993 | European Pat. Off. . |
| 2 670 901 | 6/1992 | France . |
| 3125133A1 | 1/1983 | Germany . |
| 2 221 039 | 1/1990 | United Kingdom . |

OTHER PUBLICATIONS

Patent Abstracts of Japan, 59–208429, vol. 9, No. 76, Apr. 5, 1985, p. 346.

Patent Abstracts of Japan, 61–209332, vol. 11, No. 40, Feb. 5, 1987, p. 544.

Patent Abstracts of Japan, 59–168331, vol. 9, No. 24, Jan. 31, 1985, p. 331.

"Strain–gauge transducer signal conditioning with square-wave ac excitation and thermal error compensation", Kenneth D. Hill, Review of Scientific Instruments, 56 (1985) Jul., No. 7, pp. 1413–1416.

"A Guide to Linear Circuit Design", 1993 Linear Applications Handbook, vol. II, pp. 7–8.

Primary Examiner—Richard Chilcot
Assistant Examiner—Eric S. McCall
Attorney, Agent, or Firm—Finnegan, Henderson, Farabow, Garrett & Dunner, L.L.C.

[57] ABSTRACT

In a measuring arrangement comprising a strain gage section (10) constructed of at least one SG (strain gage) (15), and integrated in a measurement pickup (1), an additional circuit (20) amplifies modulated output signals of the SG section (10), and is also integrated in the measurement pickup (1). The measuring arrangement thus obtained is used for general measuring tasks, particularly for commercially available domestic or industrial scales including weighing devices operated by means of commercially available batteries. As an additional circuit, a modulation amplifier can be used which consists of a modulator constructed as squarewave generator, an alternating-voltage amplifier and a demodulator, the demodulator being a bridge rectifier composed of four electronic (on/off) switches or two electrical changeover switches.

15 Claims, 5 Drawing Sheets

STRAIN GAGE MEASURING ARRANGEMENT, USE OF SAME, AND MODULATION AMPLIFIER FOR SUCH MEASURING ARRANGEMENTS

This application is a continuation of application Ser. No. 08/542,129, filed Oct. 12, 1995, now abandoned; which is a continuation of application Ser. No. 08/280,883, filed Jul. 27, 1994, now abandoned.

BACKGROUND OF THE INVENTION

1. Field of the Invention

The invention relates to a measuring arrangement comprising a strain gage section constructed of at least one strain gage, hereinafter SG, and integrated in a measurement pickup, and an additional circuit amplifying modulated output signals of the SG section, a use of the measuring arrangement thus obtained and a modulation amplifier which, in particular, is the said additional circuit.

2. Description of Related Art

Such measuring arrangements are of great practical interest since they are commercially usable and are used, for example, in many weighing facilities in industry.

Numerous measuring arrangements are already known in which SGs are integrated in a measurement pickup. External electronics feed the measurement pickup with a supply voltage via a connecting cable, receive its measurement signal via the same cable, amplify it and then interpret it. As a rule, such measurement pickups or measuring arrangements operate in accordance with the principle of resistance measurements. They utilize the effect, that the resistance of an SG is proportional to its elongation, that is to say to its relative change in length, and this, in turn, is proportional to the force acting on the measurement pickup. To obtain an accurate resistance measurement, the SGs are frequently connected in a bridge circuit.

A very low output or measurement signal is characteristic of such measurement pickups. In the case of the frequently used measurement pickups with metal foil SGs, the output signal is, for example, only 2 mV per volt of bridge input voltage. Such small signals must first be amplified before they are measured and processed further. For cost reasons and for the sake of simplicity, a direct voltage supply and direct voltage amplification are generally used even though they frequently have disadvantages due to their normal technical limitations, namely, direct-voltage errors such as thermoelectric voltage errors or offset voltages in the amplifier, and excessive low-frequency noise in the entire circuit. Thermoelectric voltages can occur at the connecting points of the necessary cabling between the resistance bridge and the following amplifiers, particularly if different materials and temperatures are present there.

These errors must be kept at a still acceptable level or, respectively, the measurement signal must stand out clearly from these error voltages. For example, in order to be able to provide the abovementioned output signals of 2 mV per volt of input voltage, various measures must be taken. On the one hand, the loading limits of the SG measurement pickups are frequently designed in such a manner that they are already close to the fatigue limits of the materials used at rated load. As a consequence, only very limited overload reserves remain which is why cost-intensive overload protection devices must be provided, depending on the respective application. On the other hand, to increase the output signal, very high input voltages are frequently applied to the measurement pickup in order to be able to keep it within its mechanical loading limits. Increased input voltages, however, heat up the measurement pickup resistors and thus the entire measuring arrangement. In addition, high supply voltages are not compatible with the low-frequency requirements of present-day electronic circuits. Finally, the use of battery-operated measuring arrangements is almost completely impossible due to the high power consumption.

The abovementioned measuring errors such as thermoelectric effects, noise and temperature effects in downstream external amplifiers are today frequently reduced by additional alternating-voltage modulation and amplification techniques. These modulation amplification techniques are known from the literature (for example "1993 Linear Applications Handbook Vol. 2, A guide to linear circuit design", pages 7-8) but are only used in practice if their high complexity and costs are justifiable.

Furthermore, it is known from EP 0 319 176 B1 (TOLEDO SCALES) to correct errors nonlinearities—of the SG measuring arrangement, temperature effects of the measuring bridge, temperature effects acting on the zero point and the gain of a subsequent amplifier and drifting of this gain by elaborate digital means. For this purpose, a unit consisting of the following elements: an SG bridge, an amplifier following the SG bridge, an analog-to-digital converter, a microprocessor arrangement with memory and an electronic switch for switching the bridge input voltage on and off is integrated in the measurement pickup. The input voltage is applied to the SG bridge via the electronic switch and forwarded via an amplifier to an analog-to-digital converter, and the digitized output signal of the converter is supplied to a microprocessor which corrects it by means of stored algorithms, using empirically found correction formulae and listed correction values. The digital signal thus obtained is forwarded by the unit integrated in the measurement pickup to an external control and processing device. This measuring arrangement can only be used for very costly weighing facilities, or the like, due to its highly complex integrated circuit including the microprocessor device which is also integrated.

From the literature (for example "Elektrische Meβechnik" (Electrical Measuring Techniques), E. Schrufer, Hanser-Verlag, 1992, particularly pages 240 to 243), carrier frequency bridges and measurement amplifiers are also known. In this publication, a carrier frequency generator generates an alternating voltage signal which is applied to an SG or resistance bridge. The bridge output signal is forwarded to a demodulator via an amplifier preceded and followed by a transformer (used for illustrating the signal processing curve). The demodulator—in the form of a changeover switch—is controlled by the carrier frequency generator. The transformer generates, on the one hand, the amplified original alternating voltage signal and, on the other hand, the alternating voltage signal with the opposite sign thereto, via a center tap used as neutral conductor and two further taps. These two signals are alternately supplied together with the zero point signal of the center tap to the circuit output by the changeover switch of the demodulator.

A balanced differential amplifier followed by a subtractor is frequently used as alternating-voltage amplifier (compare the attached FIG. 5 which corresponds to FIG. 3.20 in the abovementioned Schrufer reference). Since measuring instruments for electrical voltages exhibit a "hot" input and a measurement zero (frequently the housing of the measuring instrument), amplifiers for resistance bridges, the actual signal of which is the difference between two voltages $U_1$ and $U_2$ (see FIG. 5), have two inputs. The voltages at both inputs are referred to the same "measuring zero". A subtractor $V_3$ following the differential amplifier supplies the difference of these two voltages as output signal $U_a$. Thus, an output voltage referred to as "measuring zero", is present at the output of this differential amplifier unit as amplified image of the difference voltage at the input.

At this output signal $U_a$, a second negated output signal– $U_a$, can be derived via an inverter with a gain of –1. These two signals can then be supplied to a demodulator which—as described above—operates with voltages referred to as a "measuring zero". In this arrangement, the error voltage of the subtractor, designated by $U_{OS3}$ in FIG. 5, is found to be a disadvantageous factor which must still be suppressed. Moreover, the inverter must operate with high precision which can only be achieved by an elaborate circuit.

The circuit technique discussed above is widely used today since it ensures problematic further processing of the measurement signal. This is because the output voltage obtained is again available single ended with respect to a "measuring zero" and can thus be processed further by conventional measuring instruments or other electronic circuits.

However, this amplifier circuit has the disadvantage that the character of the difference signal is changed and therefore cannot be connected unchanged ahead of the external measuring instruments normally used, for example, in industrial weighing and set up for the difference signals of the SG bridges.

SUMMARY OF THE INVENTION

Based on this prior art, the invention has the object of providing a comparatively inexpensive measuring arrangement, a use which is concomitant with its advantages and a simple modulation amplifier which can be used, in particular, for this measuring arrangement.

The present invention provides a measuring arrangement with an SG, section constructed of at least one SG and an additional circuit amplifying modulated output signals of the SG section, both the SG section and the additional circuit being integrated in one measurement pickup.

In this arrangement, errors of the SG section and of the additional circuit can be directly corrected in a simple manner, on the spot, in the measurement pickup during the assembly of the measurement pickup. These errors are then suppressed for all time. Due to the integration of the SG section and the additional circuit in the measurement pickup, cable connections are kept short and thus the negative influences of any long feedline cables are avoided.

In this arrangement, the SGs are preferably connected together in a bridge circuit. However, the bridge can also consist of SG and other resistors. This measure provides a more measurement-sensitive interconnection of the SGs.

In a first preferred embodiment, the additional circuit is essentially constructed as a balanced differential amplifier. In this arrangement, a modulator can be arranged outside the measuring arrangement, for instance in an external voltage supply device. The modulated supply signal is supplied via a cable to the measuring arrangement where it is provided as input voltage to the SG bridge. The output signal of the SG bridge is amplified by the balanced differential amplifier and then applied to the output of the measuring arrangement. One advantage lies, inter alia, in the reduction of cable influences because the amplifier has a much lower output impedance than a passive high-impedance measuring bridge. In addition, a balanced differential amplifier simplifies any error corrections, since all errors can be compensated for via mass-produced electronic components. This provides a very inexpensive overall correction of the measurement signal. As a result, the measuring arrangement is also suitable for mass-produced articles. This first embodiment thus represents a particularly inexpensive version of a measuring arrangement.

The first embodiment is preferably designed to be supplied by an external alternating voltage. The additional circuit preferably exhibits additionally a rectifier which can be connected to the external alternating voltage supply for supplying the balanced differential amplifier with direct voltage. This obviates the need for a separate connection to the supply voltage of the amplifier.

In a preferred interconnection of the individual modules of the first embodiment: the voltage supply input of the measurement pickup is constructed as alternating voltage input, and is in each case connected to the input of the SG bridge and to the input of the rectifier. The output of the SG bridge is connected to the signal input of the balanced differential amplifier, and the output of the rectifier is connected to the voltage supply input of the balanced differential amplifier. The output of the differential amplifier is connected to the signal output of the measurement pickup; the measurement pickup inputs and outputs in each case exhibit two connecting points. This particularly simple interconnection of the individual modules contributes to keeping errors down, to preserving the difference character of the measuring bridge signal and to being able to connect the measurement pickup easily to external supply and interpreting circuits.

In a second preferred embodiment, the additional circuit is a modulation amplifier which essentially consists of a modulator, an alternating-voltage amplifier and a demodulator. This additional circuit offers the advantage that the modulated signal is generated directly in the measurement pickup and is demodulated again into a direct voltage. This avoids alternating voltage signals which are conducted via a cable from the measurement pickup to an external supply circuit, or conversely, are influenced by capacitive and inductive cable characteristics. In addition, direct-voltage errors of the SG interconnection can be effectively suppressed by the use of the modulation amplifier.

The modulator is preferably connected ahead of the SG section as voltage supply and, in particular, constructed as a squarewave generator. The advantage of this embodiment lies in the use of a square-wave generator as a voltage supply. It can supply an input or supply voltage, the amplitude of which can be set much more accurately than is allowed by, for example, conventional generators for sinusoidal supply voltages. Although the shape of sinusoidal signals would not be distorted when they are conducted through long cables, but only phase shifted, they have the disadvantage that elaborate and expensive devices for generating a stable, accurately settable amplitude must be provided.

The alternating-voltage amplifier of the second embodiment is preferably essentially also a balanced differential amplifier. On the one hand, the differential amplification preserves the character of the difference signals at the output of an SG measuring bridge; on the other hand, the balanced arrangement of the electronic components largely suppresses any non-ideal characteristics of these components. Overall, the amplified output signal of the alternating-voltage amplifier is thus essentially free of direct-voltage superpositions in the form of offset voltages and the like.

The demodulator is preferably essentially a bridge rectifier composed of four electronic on/off switches or two electronic changeover switches. This demodulator provides a particularly elegant and simple demodulation of the modulated measurement signal, especially in connection with the squarewave generator as modulator. As a result, the difference character of a conventional SG bridge, which is fed with a direct voltage, and also supplies a direct voltage output signal, is retained particularly effectively.

The demodulator is preferably interconnected with the modulator in such a manner that the squarewave signal of the modulator cycles the switching of the four electronic on/off switches, or the two electronic change-over switches of the demodulator. This ensures interference-free demodulation in a particularly simple manner; and from the alternating voltage measurement signal a direct voltage measurement signal is generated, which accurately simulates the output signal of a passive measuring bridge fed with a direct voltage, but amplified. Apart from the amplification, there are no differences from a passive measurement pickup as far as the outside is concerned.

A preferred interconnection of the individual modules of the additional circuit and of the SG section in the measurement pickup, connects the supply voltage input of the measurement pickup to the supply voltage inputs of the modulator, the amplifier and the demodulator; the output of the modulator to the input of the SG bridge; the output of the SG bridge to the input of the alternating-voltage amplifier; the output of the alternating-voltage amplifier to the input of the demodulator; and, finally, the output of the demodulator to the signal output of the measurement pickup. The supply voltage input and the signal output of the measurement pickup have in each case two connecting points. This particularly simple interconnection of the individual modules contributes to keeping errors down and to preserving the difference character of the measuring bridge signal.

In a preferred embodiment of the modulation amplifier, the demodulator is followed by an RC low-pass filter. This further eliminates radio-frequency voltages which can originate from non-ideal characteristics of the switches and amplifiers. However, the RC low-pass filter can be provided in an external circuit. If necessary, even the cable connecting the measuring arrangement to external interpreting devices can already act as filter due to its inductive and capacitive characteristics.

In both embodiments, the balanced difference amplifier is preceded and/or followed by temperature-dependent and -independent resistors for compensating for measurement errors of the SG bridge and of the amplifier. Compared with the normally used measures of obtaining a calibrated measurement pickup, this creates a distinct simplification of the calibration process. Usually, temperature-dependent resistors are also connected ahead of the supply voltage input of the SG bridge. This frequently used method does not guarantee reliable error compensation. In addition, the tuning is elaborate for individual different measurement pickups. Such problems do not occur in the aforementioned measure.

For error compensation, a bridge circuit composed of four bridge arms is preferably connected ahead of the two negative inputs of the balanced differential amplifier, in which bridge circuit, two bridge arms are in each case constructed of a normal resistor and a series-connected temperature-dependent resistor. In addition, a resistor is, in each case, connected between the negative inputs of the differential amplifier and the resistance bridge. Finally, the resistance bridge is arranged in parallel with the SG bridge. The parallel connection of this resistance bridge effectively compensates for the zero point of the SG bridge and its temperature effect.

A further preferred circuit variant for error compensation in both embodiments provides that the two amplifier outputs of the balanced differential amplifier, are also, in addition (to the conventional resistors) connected, via a temperature-dependent resistor. This compensates for the variation due to temperature of the SG bridge output signal and suppresses the drifting of the gain in a simple manner. This drifting frequently occurs due to the fact that the remaining resistances determining the gain fluctuate at different temperatures.

In both embodiments, a resistor can be connected ahead of the two supply voltage inputs of the SG bridge. This makes it possible to set the power consumption in the SG bridge. In consequence, this consumption can be reduced, if necessary, to such an extent that the entire measuring arrangement can be appropriately operated for a sufficiently long period of time with commercially available batteries. This measure thus opens up a large market for particularly inexpensive measuring devices.

In both embodiments, the measurement pickup and the additional circuit are preferably arranged close together in terms of space. Both embodiments thus offer the advantage of a compensation of any errors in the additional circuit and the SG bridge which is independent of external protective circuitry. This is because the conventional setting of the zero point and the correction of the temperature errors of the measurement pickup can be carried out, and the variation temperature of the zero point, and of the gain and its offset, drifting can be compensated for, in one step. For this purpose, the errors at the output of the measuring arrangement are measured and eliminated or compensated for in one step, both for the SG bridge and for the additional circuit.

The measurement pickup equipped with the SG section and the additional circuit preferably simulates a passive measurement pickup. The measurement pickup preferably exhibits four electrical connections, namely two for the input voltage and two for the output signal. The measuring arrangement thus continues to exhibit four connecting points on the outside, two of which are responsible for the voltage supply of the SG bridge and of the additional circuit, and two of which supply the (pre-) amplified output signal. Thus, a user of this measurement pickup does not recognize from the outside whether he has a passive measurement pickup, which is a measurement pickup that is not followed by an integrated (pre-)amplifier, or a measurement pickup according to the invention in his hands. Thus, all external processing devices can still be connected, as before, to the measurement pickup according to the invention. However, they are now supplied with an amplified signal.

The additional circuit is preferably constructed as a hybrid structure on ceramic with good thermal conductivity. The unit thus obtained can be bonded to the same metal of the measurement pickup on which the SG section also rests. The SG bridge and the additional circuit are thus in an isolated thermal state which is particularly advantageous in the compensation of temperature effects.

The measuring arrangements of both embodiments are preferably followed by an analog-to-digital converter and/or a microprocessor. The analog-to-digital converter can be used for improved connectability to digital interpreting devices, in which arrangement the converter alone or in combination with a microprocessor can provide a digital communication protocol or preprocessing of the signal.

According to the invention, both measuring arrangements are used for general measuring tasks, particularly for commercially available domestic or industrial scales. Thanks to the simple configuration of the additional circuits, the entire measuring arrangement manages with a low number of electronic components. This makes it particularly suitable for use in weighing devices or the like in which the voltage is provided by commercially available batteries. The first embodiment is used, in particular, in electrical devices which provide an alternating voltage as the supply voltage to the SG bridge.

The invention provides a modulation amplifier for bridge circuits which is particularly suitable for one of the two abovementioned embodiments of the measuring arrangement and essentially exhibits a modulator constructed as squarewave generator; an alternating-voltage amplifier; and, finally, a demodulator in the form of a bridge rectifier composed of four electronic (on/off) switches or two electrical changeover switches. As a result of its simple structure, this modulation amplifier is suitable as (pre-) amplifier circuit for all conceivable bridge circuits, especially if it is a matter of creating an inexpensive, easily tuned, stable and almost temperature-independent amplifier that retains the difference character of the bridge output signal. This modulation amplifier provides not only the advantages of the modulation amplifier technique or carrier-frequency modulation, respectively, but also enables already existing simple direct-voltage supplies and associated subsequent amplification or processing methods to be used at the same time.

Further advantages and developments of the invention can be obtained from the following description of preferred embodiments. In this description, reference is made to the attached schematic drawing.

BRIEF DESCRIPTION OF THE DRAWINGS

In the text which follows, identical reference symbols are used for functionally identical parts in all figures.

FIG. 1 diagrammatically illustrates the interconnection of a measurement pickup 1 according to the invention with a conventional external electronic supply and processing circuit 2. The circuit 2 supplies the measurement pickup 1 with direct voltage or alternating voltage via two connecting points 4a and 4b. At the same time, it receives its output signals via two connecting points 8a and 8b and then processes them. An SG (strain gage) bridge 10 and an additional circuit 20 are integrated in the measurement pickup 1. The configuration of the SG bridge 10, which essentially consists of the bridge inputs 14a and 14b, the bridge outputs 18a and 18b and the SG resistances 15 connected as bridge arms, and its integration in the measurement pickup 1 are known. They are therefore not described in greater detail here. The additional circuit 20 essentially consists of a modulation amplifier (FIG. 2) of a balanced differential amplifier (FIG. 3). Such amplifiers are also basically known, but not their integration in the measurement pickup 1 and the great closeness in terms of space between the SG bridge 10 and the additional circuit 20 which can thus be achieved. The measurement pickup 1 according to the invention is accordingly distinguished from a conventional passive SG measurement pickup which only exhibits an SG bridge, by its additional circuit 20.

Figure 1:
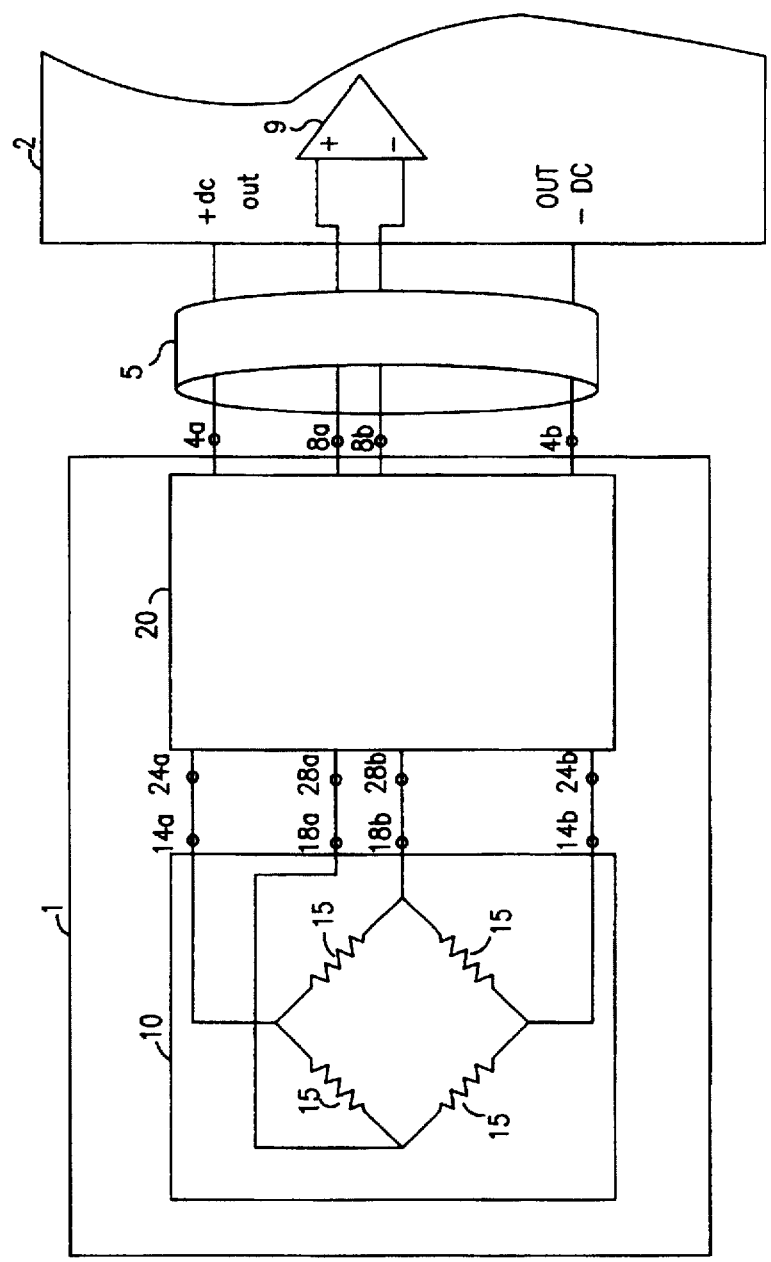
FIG. 1 shows an interconnection of a measurement pickup exhibiting an SG bridge and an additional circuit, with an external electronic voltage supply and data processing.

The external circuit 2 supplies the additional circuit 20 with direct or alternating voltage via the connecting points 4a and 4b of the measurement pickup 1. This circuit, in turn, supplies the SG bridge 10 with an alternating voltage at the two connecting points 24a and 24b. At the same time, it receives its measurement signals at the two connecting points 28a and 28b. The additional circuit 20 processes the measurement signals and forwards them via the two connecting points 8a and 8b of the measurement pickup 1 to the external circuit 2. There, the measurement signal is first amplified in a conventional manner by means of an amplifier 9 and then processed. The entire signal exchange between the measurement pickup 1 and the external circuit 2 is conducted via a feed cable 5.

The measurement pickup 1 can be obviously connected to a (conventional) external supply voltage and signal interpreting circuit 2 in exactly the same manner as a conventional passive measurement pickup. On the user side, no re-equipment at all is thus required when changing between passive measurement pickups and measurement pickups according to the invention. Neither can any difference be seen on the outside. However, the additional circuit 20 provides, at the two connecting points 8a and 8b of the measurement pickup 1, an amplified signal which is, for example, ten times larger than the output signal of the SG bridge 10 at the connecting points 28a and 28b. In this example, the measurement pickup 1 thus exhibits a ten-times lower feed current, a ten-times better weighing resolution or a ten-fold overload capacity.

Figure 2:
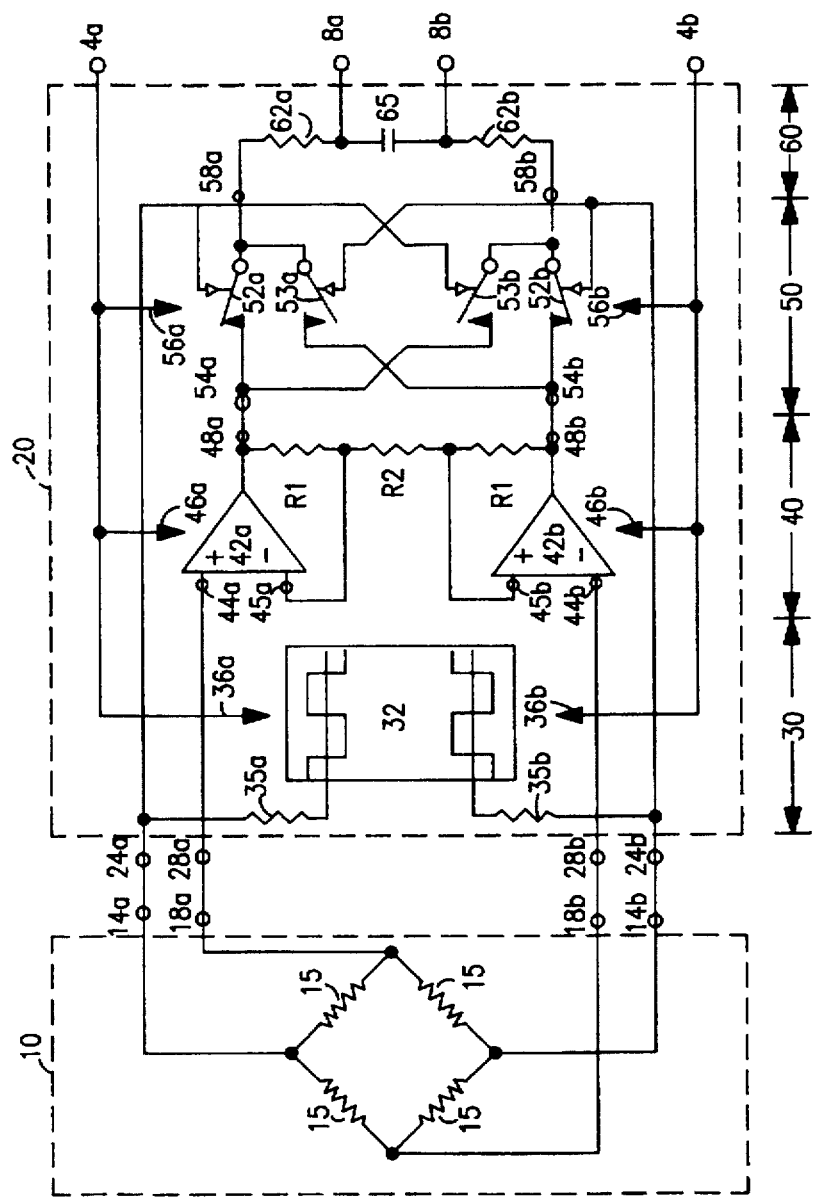
FIG. 2 shows a circuit schematic of an SG bridge with modulation amplifier.

FIG. 2 shows a preferred circuit schematic for an additional circuit 20 constructed as a modulation amplifier. The modulation amplifier essentially consists of a modulator 30, an alternating-voltage amplifier 40 and a demodulator 50. A low-pass filter 60 is also connected between the demodulator 50 and the signal output connecting points 8a and 8b.

The supply voltage supplied via the connecting points 4a and 4b (see dashed line) is a direct voltage which is present in parallel at the modulator 30, at the alternating voltage amplifier 40 and at the demodulator 50 in each case via branch lines 36a and 36b, 46a and 46b and 56a and 56b. The modulator 30 essentially contains a squarewave generator 32 which generates two alternating voltage trains offset in phase by 180° from the supply voltage. One alternating voltage train is supplied as input voltage to one input 14a of the SG bridge 10, namely via a resistor 35a and one additional circuit output 24a. The other alternating voltage train is supplied to the other input 14b of the SG bridge 10 via a resistor 35b and the other additional circuit output 24b.

The two outputs 18a and 18b of the SG bridge 10 are connected to two signal inputs 44a and 44b of the alternating voltage amplifier 40 via the two additional circuit inputs 28a and 28b. This amplifier is essentially constructed as a balanced differential amplifier and thus essentially contains two operational amplifiers 42a and 42b which are arranged symmetrically with respect to a resistor R2. The (non-negated) inputs 44a and 44b of these two operational amplifiers 42a and 42b form the signal inputs of the alternating-voltage amplifier 40. The two outputs 48a and 48b of the operational amplifiers 42a and 42b are in each case fed back to the negated operational amplifier inputs 45a and 45b via a resistor R1 and connected to one another via the series circuit: resistor R1—resistor R2—resistor R1. The gain of this balanced differential amplifier is thus calculated as G=1+2*R1/R2 and can be set via resistors R1 and R2. The two outputs 48a and 48b of the operational amplifiers 42a and 42b form the outputs of the alternating voltage amplifier 40. An amplified difference signal at these outputs in the form of an alternating voltage, the frequency and phase of which correspond to the resultant input voltage of the SG bridge 10. This difference signal is applied to the demodulator 50.

For this purpose, the two amplifier output 48a and 48b are connected to two inputs 54a and 54b of the demodulator 50. According to FIG. 2, the latter essentially consists of four analog switches 52a, 52b and 53a, 53b which connect the two inputs 54a and 54b to two outputs 58a and 58b of the demodulator 50 in such a manner that each input 54a and 54b is alternately connected to each output 58a and 58b. For this purpose, demodulator output 58a and 58b is first connected to a switch pair 52a and 53a and, respectively, 52b and 53b formed of two of the four switches 52a,b and 53a,b; namely output 58a to switches 52a and 53a and output 58b to switches 52b and 53b. In addition, each demodulator input 54a and 54b branches into two branch lines which are supplied to different switch pairs, in such a manner that the four branch lines and the four switches 52a,b and 53a,b are reversibly unambiguously allocated to one another. The switching over or ON/OFF of the four switches 52a,b and 53a,b is controlled by the two squarewave output signals of the modulator 30, that is to say by those signals which are also supplied as input voltage to the SG bridge 10. For this purpose, each of the two modulator output signals simultaneously cycles exactly one switch in each of the two switch pairs 52a, 53a and 52b, 53b in such a manner that the two switches 52a, 53b or 53a, 52b cycled by the same signal alternately open and close and during this process always assume complementary switching states with respect to one another. As a result, the demodulator 50 forms a bridge rectifier which exchanges the connection between its inputs and outputs cyclically at the rate of the modulation frequency. Thus, a "differential" direct voltage, the amplitude of which corresponds to that of the alternating voltage at the outputs 48a and 48b of the alternating-voltage amplifier 40, is present at the outputs 58a and 58b of the demodulator 50.

The circuit thus provides a phase-sensitive demodulation of the alternating voltage signal into a direct-voltage output signal.

According to FIG. 2, the demodulator outputs 58a and 58b are connected to the outputs 8a and 8b of the measurement pickup 1 via the simple RC low-pass filter 60. The low-pass filter 60 suppresses radio-frequency voltages which can occur due to imperfect switches and amplifier circuits. It consists of two series-connected resistors 62a and 62b and an intermediately arranged capacitor 65. The output of the low-pass filter 60 is picked up via the capacitor 65. The voltage at the outputs 8a and 8b of the measurement pickup 1, which are connected to the low-pass tap, is an amplified but otherwise accurate image of the direct voltage which is supplied by the conventional passive measurement pickups initially mentioned: that is to say measurement pickups which essentially exhibit only one SG bridge with the connecting points 14a,b and 18a,b and, respectively, 24a,b and 28a,b. In this comparison, it must also be taken into consideration that the two resistors 62a and 62b would have to be given exactly one half of the value of the output impedance of the passive measurement pickup.

In principle, the low-pass filter 60 can also be omitted and either the feed cable 5 (connecting the external circuit 2 and the measurement pickup 1) with its capacitive and inductive characteristics can be used as low-pass filter or a low-pass filter can be provided in the external circuit 2.

Figure 3:
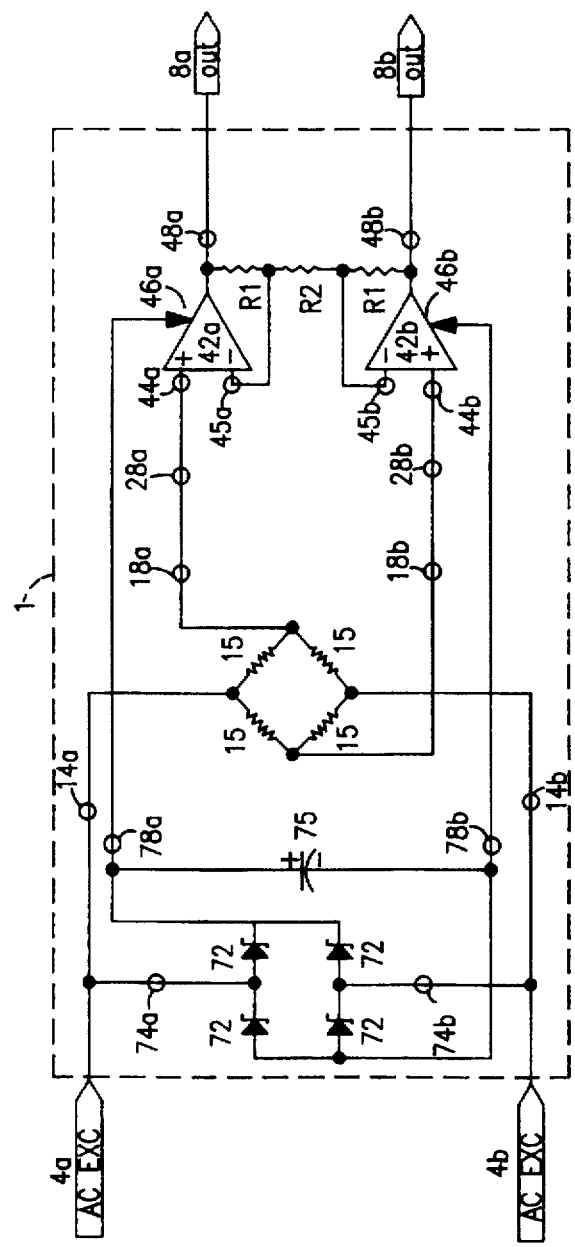
FIG. 3 shows a circuit schematic of an SG bridge with a balanced differential amplifier with an external alternating-voltage feed.

FIG. 3 shows a circuit schematic of a measurement pickup 1 which is fed with an alternating voltage from outside and outputs an alternating voltage as measurement signal. For this purpose, the measurement pickup 1 exhibits the two feed connecting points 4a and 4b and the measurement signal connecting points 8a and 8b. Essentially it again consists of the SG bridge 10 with the additional circuit 20 which here, however, is constructed as balanced differential amplifier 40 with additional bridge rectifier 70. In comparison with the additional circuit of FIG. 2, the modulator 30, the demodulator 40 and the law-pass filter 60 have been omitted here but, instead, the bridge rectifier 70 has been added. The supply voltage input at the connecting points 4a and 4b and possibly modulated is internally supplied both to the SG bridge 10 by its inputs 14a and 14b and to the rectifier 70 by its inputs 74a and 74b. The latter is composed of four diodes 72. The rectifier 70 forms from the alternating voltage signal obtained via its input connecting points 74a and 74b a direct voltage which is applied from its two output connecting points 78a and 78b to the voltage supply branch lines 46a and 46b of the balanced differential amplifier 40. The two output connecting points 78a and 78b of the rectifier 70 are followed in parallel by a capacitor 75 for smoothing the supply voltage.

The two outputs 18a and 18b of the SG bridge 10 are connected via the two additional circuit inputs 28a and 28b to the two signal inputs 44a and 44b of the balanced differential amplifier 40. As in the preceding illustrative embodiments, the amplified difference signal present at the two outputs 48a and 48b of the alternating voltage amplifier 40 is an alternating voltage with the same frequency and phase as the resultant input voltage of the SG bridge 10. This output signal is supplied to the output of the measurement pickup via the two output connecting points 8a and 8b.

From the outside, an alternating voltage signal of any form can thus be applied to the measurement pickup 1 by the external circuit 2, an amplified measurement signal being fed back to the external circuit 2 from the output of the measurement pickup 1.

The missing direct voltage as supply voltage for the balanced differential amplifier 40 is thus generated by the rectifier 70 which rectifies the modulated alternating voltage, applied for feeding the SG bridge 10, for the alternating voltage amplifier 40.

According to the invention, a balanced differential amplifier 40 is used in the two embodiments of FIGS. 2 and 3. This provides at least three advantages. Firstly, a simple simulation of the difference character of the SG bridge 10 is achieved as can be seen from the balanced arrangement of the individual components in FIGS. 2 and 3. Secondly, errors which, for example, originate from imperfect electronic components (for example crosstalk of the control signals to the output of the switches 52a,b and 53a,b) are largely suppressed thanks to the balanced difference structure throughout the entire circuit. Thirdly, no direct voltage is superimposed as error voltage on the demodulated signal due to the formation of the difference.

Figure 4:
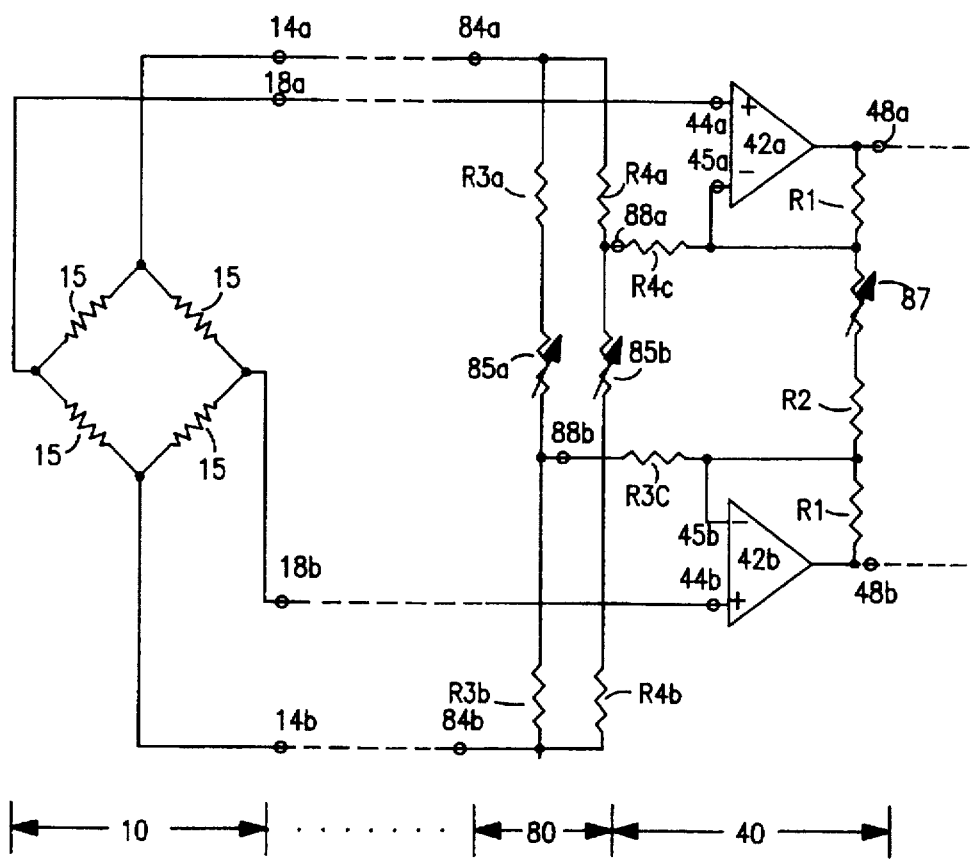
FIG. 4 shows a section of a modulation amplifier which shows the amplifier section and error correction elements.
Figure 5:
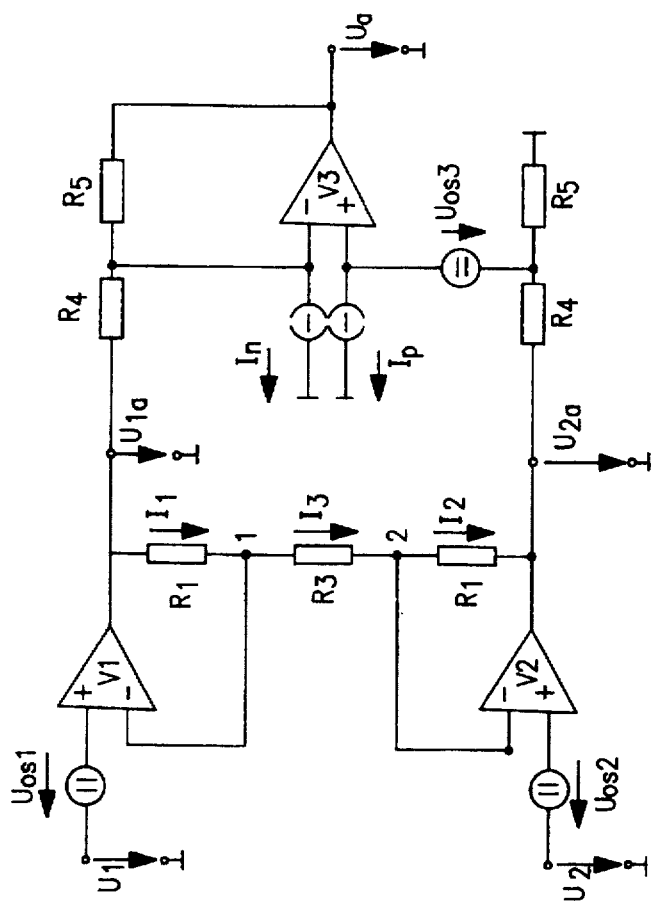
FIG. 5 shows a balanced differential amplifier followed by a subtractor according to the prior art.

In both embodiments, it is possible to achieve independent compensation of errors of the passive measuring bridge via additional compensation resistors. FIG. 4 shows a resistor network which is added to the balanced differential amplifier 40. The resistor network essentially consists of a resistance bridge 80 and three additional resistors R3c, R4c and 87. The resistance bridge 80 has the two bridge inputs 84a and 84b and the two bridge outputs 88a and 88b. The bridge inputs 84a and 84b are connected in parallel with the inputs 14a and 14b of the SG bridge 10. The bridge output 88a is connected via the resistor R4c to the negated input 45a of the operational amplifier 42a; the bridge output 88b is connected via the resistor R3c to the negated input 45b of the operational amplifier 42. The resistance bridge 80 is composed of resistors R3a,b and R4a,b and temperature-dependent resistors 85a,b in such a manner that resistor R4a forms a first bridge arm, resistor R4b, together with the temperature-dependent resistor 85b, forms a second bridge arm, resistor R3b forms a third bridge arm and resistor R3a, together with the temperature-dependent resistor 85a, forms a fourth bridge arm. In this arrangement, the bridge output 88a of the resistance bridge 80 is tapped off between the first and second bridge arm; the bridge output 88b is tapped off between the third and fourth bridge arm. The temperature-dependent resistor 87 is connected in series with resistor R2 and, together with resistors R1 and R2, determines the gain of the balanced differential amplifier 40.

Resistors R3a,b,c and R4a,b,c, together with the temperature-dependent resistors 85a,b, thus balance the zero point of the SG bridge 10, the temperature-dependent resistors 85a,b also compensating for a temperature-dependent zero-point shift in the SG bridge 10 and the balanced differential amplifier 40 and the temperature-dependent resistor 87 compensating for the variation with temperature of the SG bridge output signal and the gain of the balanced differential amplifier 40. This compensation is identical for alternating-voltage or direct voltage supply and amplification.

I claim:

1. A unitary strain gage pickup device, comprising:
   a measurement pickup member having first and second opposite edges;
   the measurement pickup member including a strain gage section positioned adjacent the first edge of the pickup member, said strain gage section including at least one strain gage having a bridge with a pair of input arms and a pair of output arms, said output arms for conducting measurement output signals, said strain gage section having a first end adjacent the first edge of the measurement pickup member and a second end opposite the first end;
   the measurement pickup member including an additional circuit positioned between the second edge of the pickup member and the second end of the strain gage section, said additional circuit being oriented so that a first side thereof opposes the second end of the strain gage section,
   said additional circuit including an amplifier, having an input, for amplifying the measurement output signals of the strain gage section, and including a modulator for supplying the input arms of the strain gage section with an alternating voltage;
   a first plurality of connecting points adjacent the second end of the strain gage section and the opposing first side of the additional circuit connecting the alternating voltage of the modulator to the input arms of the bridge of the strain gage section and connecting the measurement signals from the output arms of the bridge of the strain gage section to the input of the amplifier of the additional circuit, and
   a second plurality of connecting points adjacent the second edge of the measurement pickup member and the second side of the additional circuit for connecting the additional circuit to a voltage source external of the base member.

2. The unitary strain gage device of claim 1, further comprising,
   a third plurality of connecting points adjacent the second edge of the pickup member and the second side of the additional circuit for connecting the output of the amplifier of the additional circuit to a processing circuit.

3. The unitary strain gage device of claim 1 wherein the amplifier is configured to amplify the measurement output signals of the strain gage section by an order of magnitude.

4. The unitary strain gage device of claim 2, further comprising,
   a single cable comprised of conductors connected to both the second and third plurality of connecting points for to the voltage source and the processing circuit.

5. The unitary strain gage device of claim 1 wherein the measurement pickup member which integrates the strain gage section and the additional circuit, comprises a thermally conductive ceramic portion and a metal portion of the strain gage section bonded to one another.

6. The device of claim 1 wherein the additional circuit includes a demodulator.

7. The device of claim 6 wherein the modulator includes a square wave generator, the demodulator includes a bridge rectifier, said bridge rectifier including four electronic on/off switches; and
   the demodulator being electrically connected to the modulator for cycling the corresponding four electronic on/off switches in response to the square wave signals of the modulator.

8. The device of claim 6 wherein the modulator includes a square wave generator, the demodulator includes a bridge rectifier, said bridge rectifier including two changeover switches; and
   the demodulator being electrically connected to the modulator for cycling the corresponding two changeover switches in response to the square wave signals of the modulator.

9. The device of claim 6 wherein the additional circuit includes an RC low pass filter at an output of the demodulator.

10. The device of claim 1 wherein the amplifier includes a balanced differential amplifier.

11. The device of claim 10 wherein the balanced differential amplifier comprises two amplifiers interconnected at their output, and further comprises a temperature dependent resistor connected to said output to compensate for temperature caused variation in gain and errors of the strain gage output signal.

12. The device of claim 1 further comprising a resistor connected between each of the supply voltage and the respective input arms of the bridge.

13. The device of claim 1 wherein the combination of the strain gage section and the additional circuit of the unitary strain gage pickup device is configured to emulate a passive strain gage pickup.

14. The device of claim 1 wherein the second plurality of connecting points for connecting the additional circuit to the voltage source consists of two connecting points, and the third plurality of connecting points for connecting the measurement output signal of the strain gage to the processing circuit consists of two connecting points.

15. The unitary strain gage device of claim 14 wherein the measurement pickup member which integrates the strain gage section and the additional circuit, comprises a thermally conductive ceramic portion and a metal portion of the strain gage section bonded to one another.

* * * * *